(12) United States Patent
Voogel

(10) Patent No.: US 7,239,173 B1
(45) Date of Patent: Jul. 3, 2007

(54) PROGRAMMABLE MEMORY ELEMENT WITH POWER SAVE MODE IN A PROGRAMMABLE LOGIC DEVICE

(75) Inventor: Martin L. Voogel, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 125 days.

(21) Appl. No.: 11/221,289

(22) Filed: Sep. 7, 2005

(51) Int. Cl.
*G06F 7/38* (2006.01)
*H03K 19/173* (2006.01)
*H03K 19/177* (2006.01)
*H01L 25/00* (2006.01)

(52) U.S. Cl. .................. 326/38; 326/37; 326/38; 326/39; 326/40; 326/41; 326/47; 716/16

(58) Field of Classification Search ............ 326/37–41, 326/47
See application file for complete search history.

(56) References Cited

U.S. PATENT DOCUMENTS

| | | | | |
|---|---|---|---|---|
| 5,594,367 A * | 1/1997 | Trimberger et al. | ........... | 326/41 |
| 5,889,411 A * | 3/1999 | Chaudhary | .................... | 326/39 |
| 5,914,616 A * | 6/1999 | Young et al. | .................. | 326/41 |
| 5,920,202 A * | 7/1999 | Young et al. | .................. | 326/39 |
| 6,011,730 A * | 1/2000 | Sample et al. | ......... | 365/189.05 |
| 6,020,760 A * | 2/2000 | Sample et al. | ................. | 326/41 |
| 6,051,992 A * | 4/2000 | Young et al. | .................. | 326/41 |
| 6,124,731 A * | 9/2000 | Young et al. | .................. | 326/41 |
| 6,191,613 B1 * | 2/2001 | Schultz et al. | ................. | 326/39 |
| 6,384,627 B1 * | 5/2002 | Fross et al. | .................... | 326/39 |
| 6,708,191 B2 * | 3/2004 | Chapman et al. | ........... | 708/235 |
| 6,897,678 B2 * | 5/2005 | Zaveri et al. | ................. | 326/39 |
| 2004/0008055 A1 * | 1/2004 | Khanna et al. | ............... | 326/40 |

OTHER PUBLICATIONS

Xilinx, Inc.; "Virtex-II Pro Platform FPGA Handbook"; published Oct. 14, 2002, available from Xilinx, Inc.; 2100 Logic Drive, San Jose, California 95124; pp. 51.

* cited by examiner

*Primary Examiner*—Rexford Barnie
*Assistant Examiner*—Dylan White
(74) *Attorney, Agent, or Firm*—Lois D. Cartier

(57) ABSTRACT

A memory element structure in a programmable logic device (PLD) reduces power consumption by placing the memory element in a power save mode when the memory element is unused in a user design implemented in the PLD. An exemplary structure includes a multiplexer driving a memory element. A multiplexer control circuit controls the multiplexer, and also drives a clock control circuit for the memory element. When the memory element is used by a user design implemented in the PLD, one of the data inputs is selected to drive the memory element. The controlled functions occur normally in the memory element. When the memory element is not used by the user design, none of the data inputs is selected, an input control signal is intercepted by the clock control circuit, and the controlled functions do not occur in the memory element, reducing the power consumption of the unused memory element.

20 Claims, 8 Drawing Sheets

US 7,239,173 B1

PROGRAMMABLE MEMORY ELEMENT WITH POWER SAVE MODE IN A PROGRAMMABLE LOGIC DEVICE

FIELD OF THE INVENTION

The invention relates to programmable logic devices (PLDs). More particularly, the invention relates to a PLD structure including memory elements having a power save mode that can be invoked, for example, when the memory elements are not utilized by a user design implemented in the PLD.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

An FPGA configurable logic block (CLB) typically includes one or more groups of related lookup tables and memory elements. The lookup tables (LUTs) are related to one another in that the LUT output signals are coupled to a common carry chain, and the memory elements are typically also related in that each can be optionally driven by the output signal from one of the LUTs. Such a group of logic is commonly known as a "slice". For example, FIGS. 6A and 6B of U.S. Pat. No. 5,914,616 each illustrate one slice from the well-known Virtex™ FPGA currently available from Xilinx, Inc. (U.S. Pat. No. 5,914,616 is hereby incorporated herein by reference in its entirety.) Together, these two slices make up one CLB of the Virtex FPGA.

In order to reduce the number of transistors required to implement a slice, the memory elements within a slice typically share common control signals, e.g., clock, clock enable, set, and/or reset signals. Because the user logic implemented in a slice is often related, the logic targeted to memory elements within one slice can typically share common control signals without significant loss of implementation efficiency.

FIG. 1 shows how memory elements share control signals in a known FPGA, the Virtex-II Pro™ FPGA from Xilinx, Inc. (FIG. 1 is derived from a figure on page 51 of the "Virtex-II Pro Platform FPGA Handbook", published Oct. 14, 2002 and available from Xilinx, Inc., 2100 Logic Dr., San Jose, Calif., which page is hereby incorporated herein by reference.) In the Virtex-II Pro PFGA, each slice includes two memory elements, each configurable as either a latch or a flip-flop. As shown in FIG. 1, memory elements FFX and FFY in each slice share common clock (CK), clock enable (CkE), and S/R (set/reset) signals.

More specifically, memory element FFX has a data input terminal Dt driven by a data input multiplexer 102, which selects between data input DX and a bypass data input BX (optionally inverted by programmable multiplexer 115). Memory element FFY has a data input terminal D driven by a data input multiplexer 101, which selects between data input DY and a bypass data input BY (optionally inverted by programmable multiplexer 111). The clock enable (CkE) input terminal of each memory element FFX, FFY is driven by a clock enable signal CE optionally inverted by multiplexer 112. The clock (CK) input terminal of each memory element FFX, FFY is driven by a clock signal CLK optionally inverted by multiplexer 113. The set/reset (S/R) input terminal of each memory element FFX, FFY is driven by a set/reset signal SR optionally inverted by multiplexer 114. The reverse set/reset (REV) input terminal of each memory element FFX, FFY is optionally driven (as controlled by programmable switches 122, 121, respectively) by the bypass signal BY optionally inverted by multiplexer 111.

In the Virtex-II Pro slice, some programmable attributes for the memory elements apply to both memory elements in the slice, while others are individually controllable for each memory element. For example, the following attributes are specific to each flip-flop: INIT0 (initialize to a low value); INIT1 (initialize to a high value); SRHIGH (signal S/R sets the value in the memory element; signal REV resets the value); and SRLOW (signal S/R resets the value in the memory element; signal REV sets the value). However, if synchronous functionality is selected for the slice, this selection applies to both memory elements. Similarly, a selection of asynchronous functionality applies to both memory elements.

Power consumption is an important consideration for PLD systems designers. Particularly with today's larger PLDs, power consumption can be such a critical issue that it can dictate the choice of whether or not a given PLD can be used to implement a particular user design. Therefore, it is desirable to find methods of reducing power consumption in PLDs. Because many available PLDs include thousands of programmable memory elements, programmable memory elements having reduced power consumption could provide a significant power savings over currently available circuits.

SUMMARY OF THE INVENTION

A memory element structure in a programmable logic device (PLD) reduces power consumption by placing the memory element in a power save mode when the memory element is unused in a user design implemented in the PLD. A "slice" of programmable logic includes a number of memory elements having shared control signals. When fewer than all of the memory elements in the slice are utilized by a user design, the unused memory elements are placed in power save mode and edges occurring on the control signals are ignored by the unused memory elements. The used memory elements continue to function in a normal manner.

According to one embodiment, a memory element includes a multiplexer and a memory element having a data input terminal driven by the multiplexer. A multiplexer control circuit is coupled to select terminals of the multiplexer, and also drives a clock control circuit for the memory element. The clock control circuit can control, for example, loading, initialization, set, and/or reset functions for the memory element. When the multiplexer is in a first mode, one of the data inputs is selected to drive the data input terminal of the memory element, i.e., the memory element is used by a user design configured into the PLD. Loading, initialization, set, and reset functions occur normally in the memory element. When the multiplexer is in a second mode, none of the data inputs is selected to drive the data input terminal of the memory element, i.e., the memory element is not used by the user design. An input control signal is intercepted by the clock control circuit, and loading, initialization, set, and reset functions do not occur in the memory element, reducing the power consumption of the unused memory element.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

The present invention has been found to be particularly applicable and beneficial for use in programmable logic devices (PLDs). An appreciation of the present invention is presented by way of specific examples utilizing PLDs such as field programmable gate arrays (FPGAs). However, the present invention is not limited by these examples, and can be practiced in integrated circuits other than PLDs, or in circuits other than integrated circuits.

Figure 1:
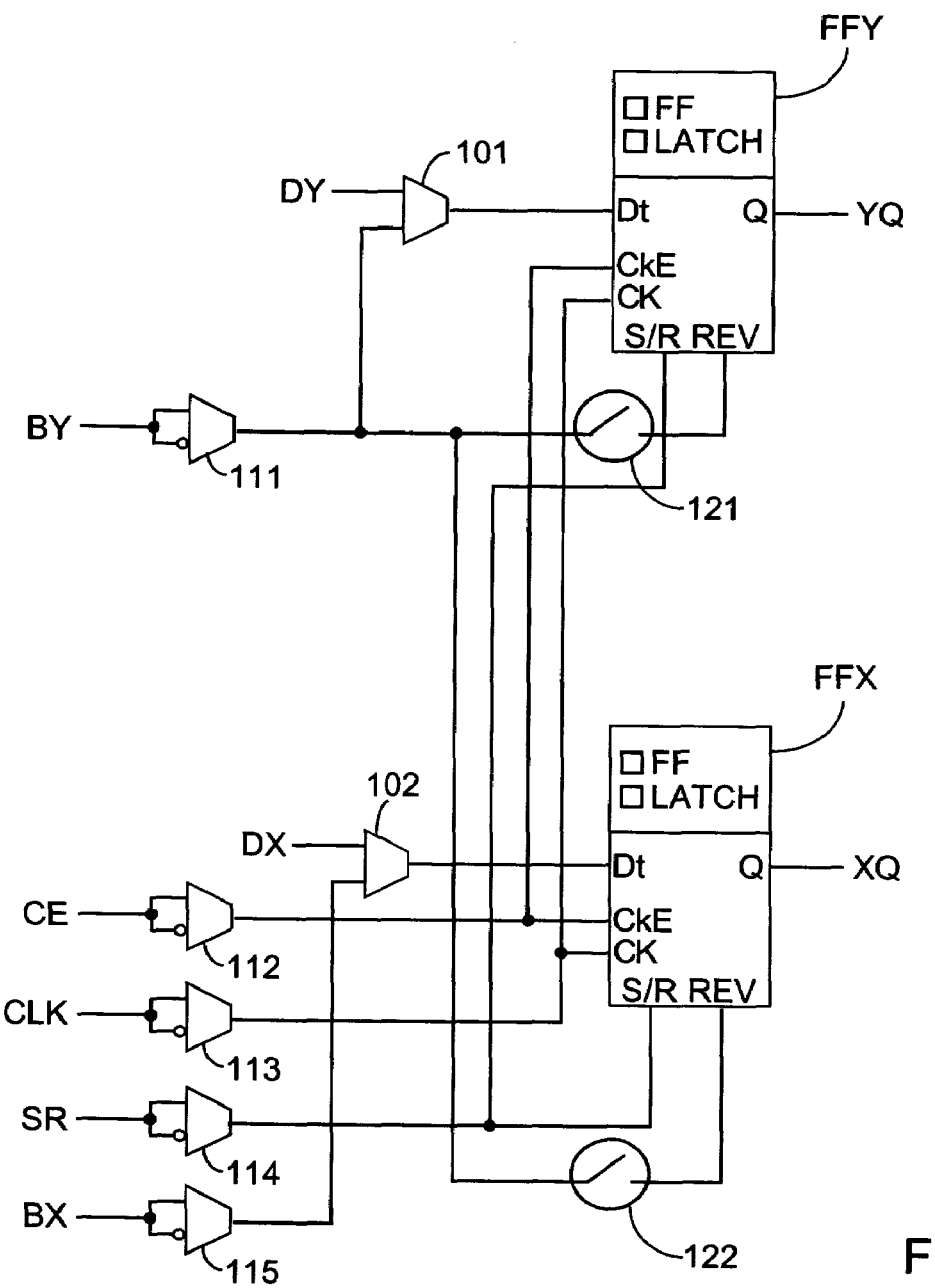
FIG. 1 illustrates a programmable slice from a known FPGA architecture, and a variety of control signals for the memory elements in the slice.

It is not uncommon for a user design to be implemented in an FPGA in such a way that only one of the memory elements in a slice is utilized. In this situation, because the two memory elements share clocks and other control signals (e.g., see FIG. 1), both memory elements will change state as dictated by the common control signals. Therefore, both memory elements will consume power, even though only one of them is being used. In known FPGAs, in which each slice includes two memory elements, this situation can lead to half (50%) of the memory elements in a slice consuming unnecessary power. In a newer generation of FPGAs, each slice includes four memory elements. Therefore, when only one of the four memory elements is used in a design, three-fourths (75%) of the memory elements in a slice can consume power unnecessarily, as the three unused memory elements are clocked for loading new data, initialized to known values, set, and/or reset, along with the one memory element that actually needs to change state. Therefore, it is desirable to include in this newer generation of FPGAs a mechanism for reducing the power consumption of these unused memory elements.

Figure 2:
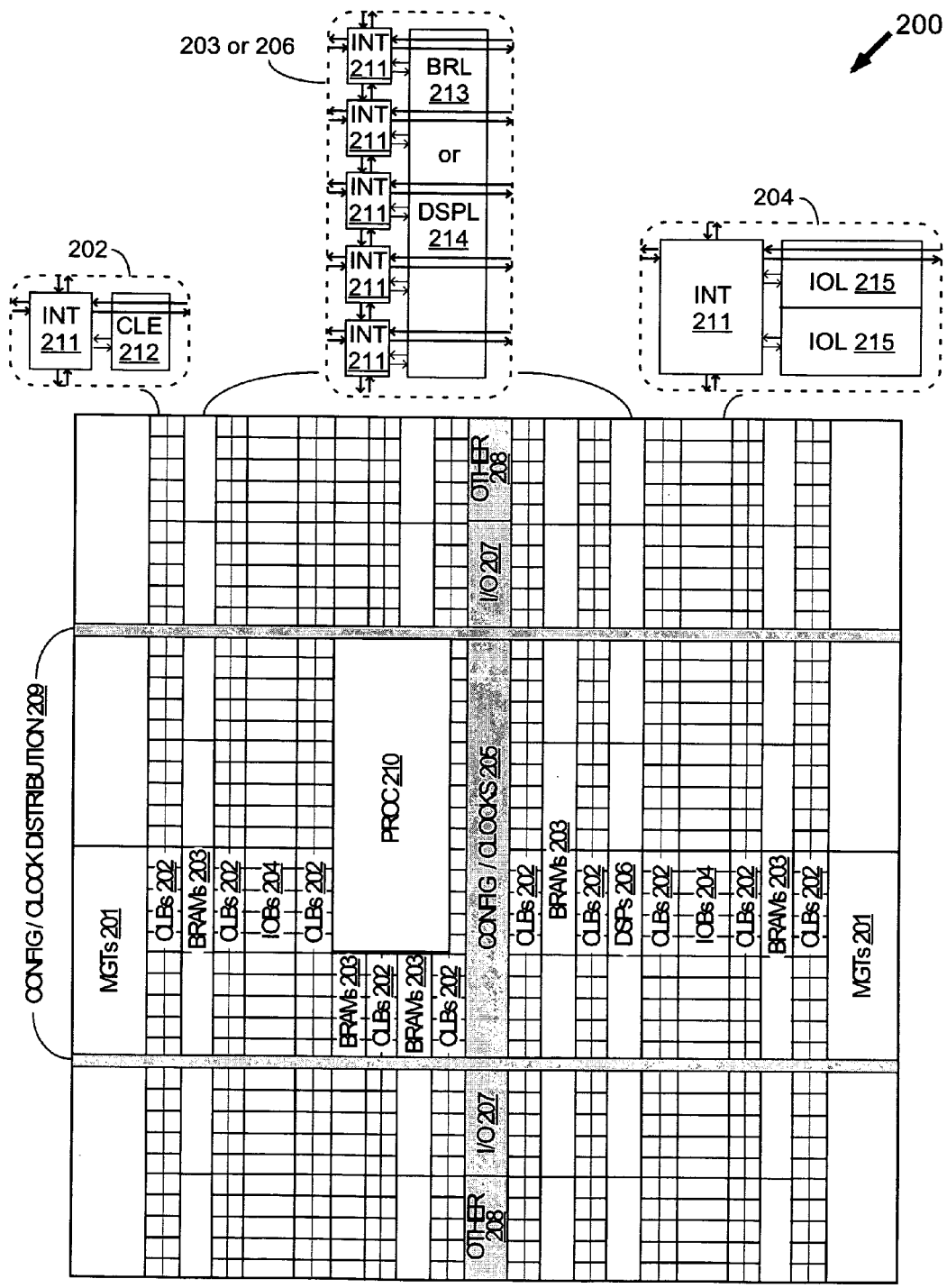
FIG. 2 illustrates an FPGA architecture that includes several different types of programmable logic blocks.

FIG. 2 illustrates a first FPGA to which the present invention can be advantageously applied. FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 3:
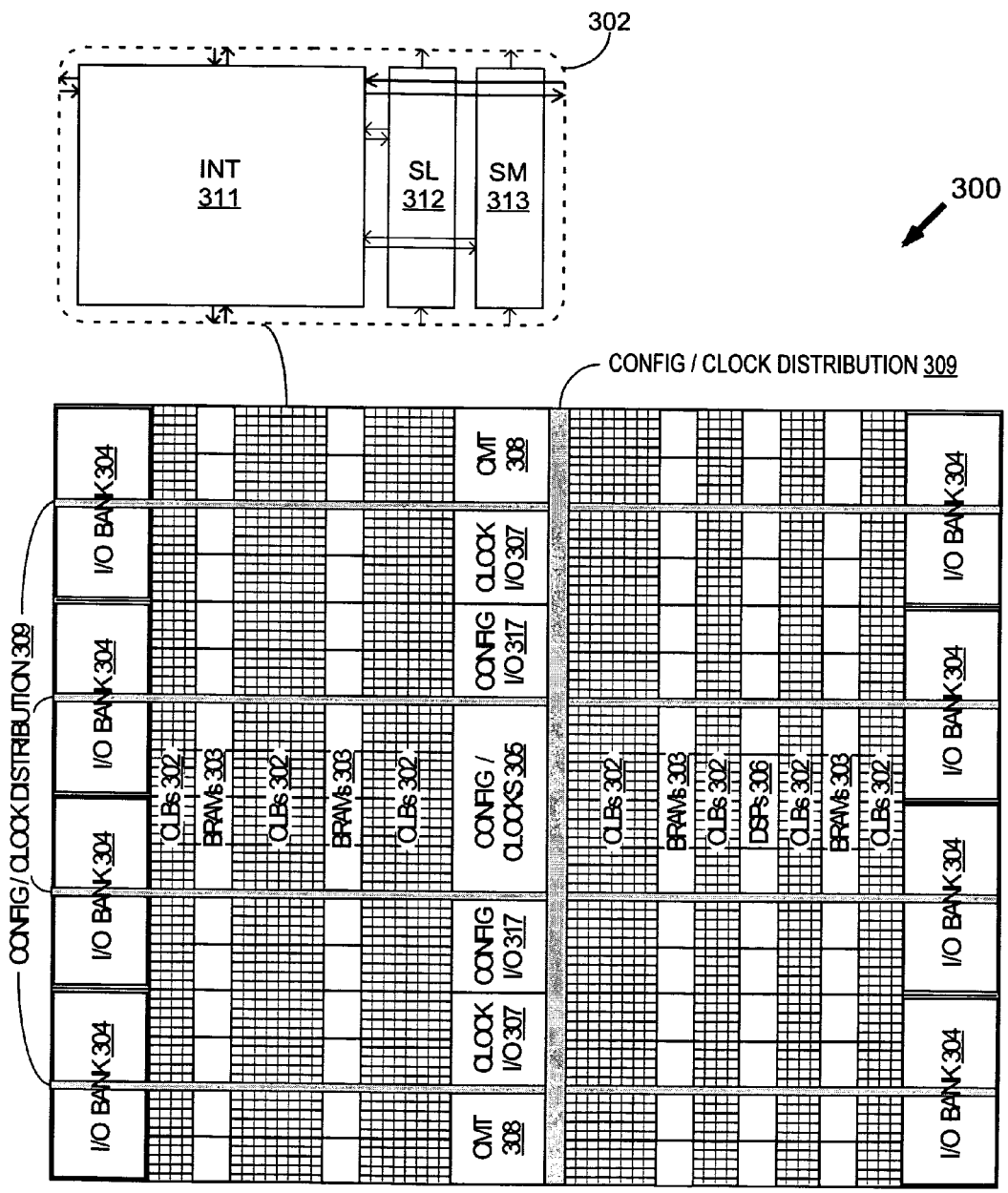
FIG. 3 illustrates another FPGA architecture that includes several different types of programmable logic blocks.

FIG. 3 illustrates an exemplary FPGA 300 utilizing the general architecture shown in FIG. 2. The FPGA includes CLBs 302, BRAMs 303, I/O blocks divided into "I/O Banks" 304 (each including 40 I/O pads and the accompanying logic), configuration and clocking logic 305, DSP blocks 306, clock I/O 307, clock management circuitry (CMT) 308, configuration I/O 317, and configuration and clock distribution areas 309.

In the FPGA of FIG. 3, an exemplary CLB 302 includes a single programmable interconnect element (INT 311) and two different "slices", slice L (SL 312) and slice M (SM 313). In some embodiments, the two slices are the same (e.g., two copies of slice L, or two copies of slice M). In other embodiments, the two slices have different capabilities, as shown in the exemplary embodiment illustrated in FIGS. 4 and 6. In some embodiments, some CLBs include two different slices and some CLBs include two similar slices. For example, in some embodiments some CLB columns include only CLBs with two different slices, while other CLB columns include only CLBs with two similar slices.

Figure 4:
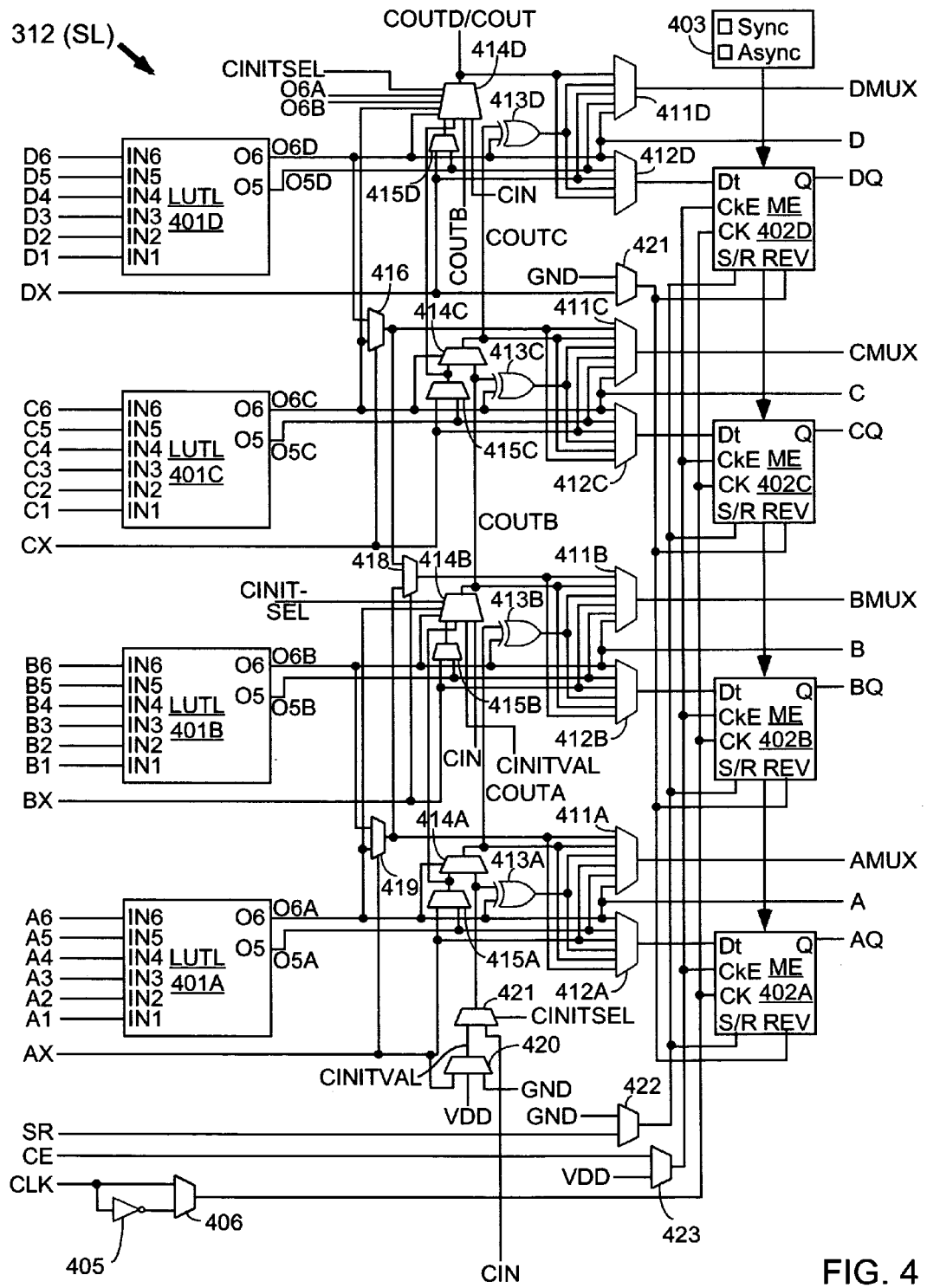
FIG. 4 illustrates a first programmable slice that can be included, for example, in the FPGAs of FIGS. 2 and 3.

FIG. 4 illustrates one embodiment of slice L (SL 312) that can be used, for example, in the FPGA of FIG. 3. In some embodiments, CLB 302 includes two or more copies of slice 312. In other embodiments, only one copy of slice 312 is included in each CLB. In other embodiments, the CLBs are implemented without using slices or using slices other than those shown in the figures herein.

In the embodiment of FIG. 4, slice L includes four lookup tables (LUTLs) 401A–401D, each driven by six LUT data input terminals A1–A6, B1–B6, C1–C6, and D1–D6 and each providing two LUT output signals O5 and O6. (In the present specification, the same reference characters are used to refer to terminals, signal lines, and their corresponding signals.) The O6 output terminals from LUTs 401A–401D drive slice output terminals A–D, respectively. The LUT data input signals are supplied by the FPGA interconnect structure (not shown in FIG. 4) via input multiplexers (not shown in FIG. 4), and the LUT output signals are also supplied to the interconnect structure. Slice L also includes: output select multiplexers 411A–411D driving output terminals AMUX–DMUX; multiplexers 412A–412D driving the data input terminals of memory elements 402A–402D; combinational multiplexers 416, 418, and 419; bounce multiplexer circuits 422–423; a circuit represented by inverter 405 and multiplexer 406 (which together provide an optional inversion on the input clock path); and carry logic comprising multiplexers 414A–414D, 415A–415D, 420–421 and exclusive OR gates 413A–413D. All of these elements are coupled together as shown in FIG. 4. Where select inputs are not shown for the multiplexers illustrated in FIG. 4, the select inputs are controlled by configuration memory cells. These configuration memory cells, which are well known, are omitted from FIG. 4 for clarity, as from other selected figures herein.

In the pictured embodiment, each memory element 402A–402D can be programmed to function as a synchronous or asynchronous flip-flop or latch. The selection between synchronous and asynchronous functionality is made for all four memory elements in a slice by programming Sync/Asynch selection circuit 403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 402A–402D are clocked by a clock signal CK, e.g., provided by a global clock network or by the interconnect structure. An exemplary implementation of memory elements 402A–402D is provided in FIGS. 6–8. Each memory element 402A–402D provides a registered output signal AQ–DQ to the interconnect structure.

Each LUT 401A–401D provides two output signals, O5 and O6. The LUT can be configured to function as two 5-input LUTs with five shared input signals (IN1–IN5), or as one 6-input LUT having input signals IN1–IN6.

Figure 5:
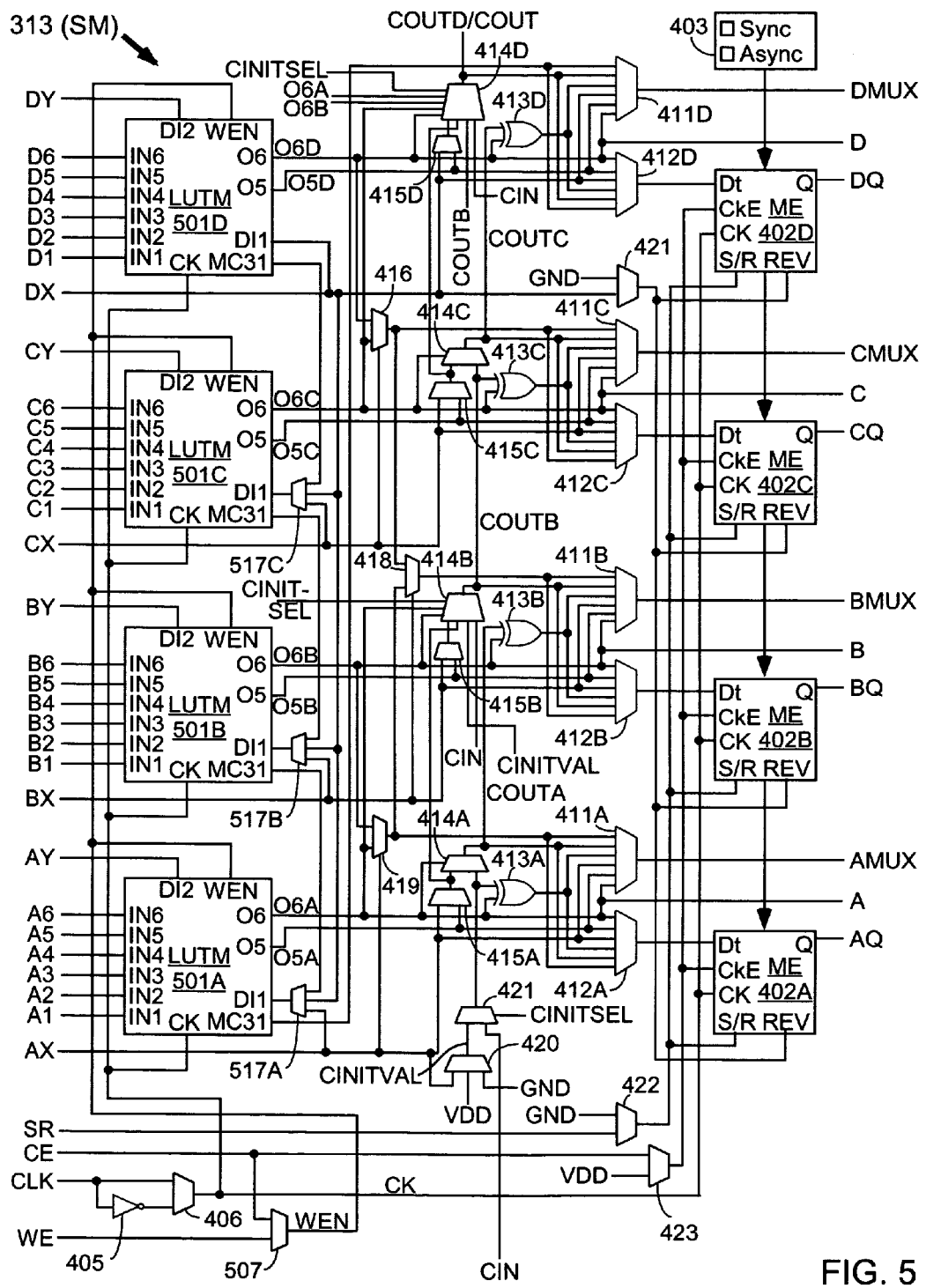
FIG. 5 illustrates a second programmable slice that can be included, for example, in the FPGAs of FIGS. 2 and 3.

FIG. 5 illustrates one embodiment of slice M (SM 313) that can be used, for example, in the FPGA of FIG. 3. In some embodiments, CLB 302 includes two or more copies of slice 313. In other embodiments, only one copy of slice 313 is included in each CLB. In other embodiments, the CLBs are implemented without using slices or using slices other than those shown in the figures herein.

Slice M is similar to slice L of FIG. 4, except for added functionality in the LUTs and additional circuitry associated with this added functionality. Similar elements are numbered in a similar manner to those in FIG. 4. In the embodiment of FIG. 5, each LUTM 501A–501D can function in any of several modes. When in lookup table mode, each LUT has six data input signals IN1–IN6 that are supplied by the FPGA interconnect structure (not shown in FIG. 5) via input multiplexers (not shown in FIG. 5). One of 64 data values is programmably selected from configuration memory cells based on the values of signals IN1–IN6. When in RAM mode, each LUT functions as a single 64-bit RAM or two 32-bit RAMs with shared addressing. The RAM write data is supplied to the 64-bit RAM via input terminal DI1 (via multiplexers 617A–617C for LUTs 601A–601C), or to the two 32-bit RAMs via input terminals DI1 and DI2. RAM write operations in the LUT RAMs are controlled by clock signal CK from multiplexer 406 and by write enable signal WEN from multiplexer 507, which can selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals can be provided through the LUT output terminals, and the 32-bit shift out signal can also be provided more directly via LUT output terminal MC31. The 32-bit shift out signal MC31 of LUT 601A can also be provided to the general interconnect structure for shift register chaining, via output select multiplexer 411D and CLE output terminal DMUX.

Figure 6:
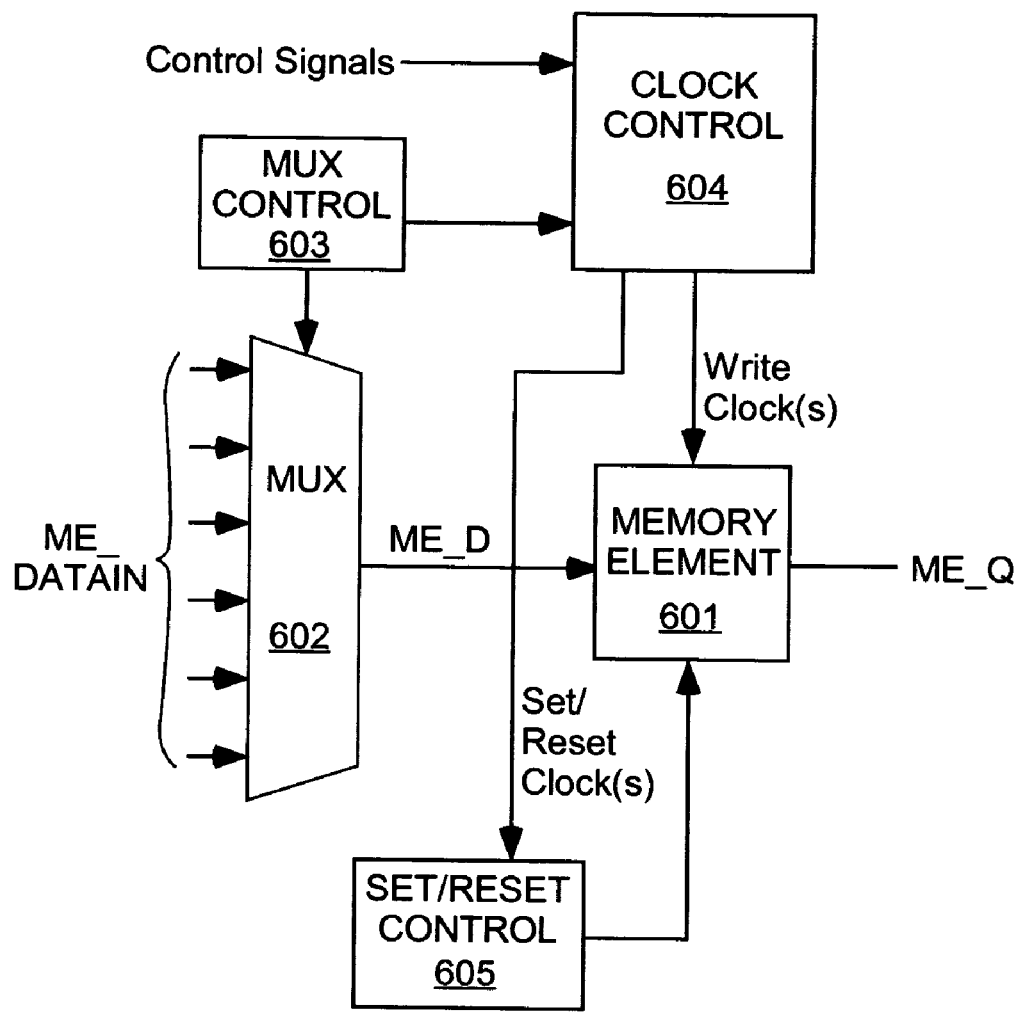
FIG. 6 illustrates an exemplary memory element structure that can be included, for example, in the slices of FIGS. 4 and 5.

FIG. 6 illustrates an exemplary memory element structure that can be included, for example, in the slices of FIGS. 4 and 5. The memory element structure of FIG. 6 reduces power consumption by placing the memory element 601 in a power save mode when the memory element is unused in a user design implemented in the PLD. An exemplary slice (e.g., slice L or slice M) of programmable logic includes four copies of the memory element structure illustrated in FIG. 6. The four memory element structures have shared clock (CK), clock enable (CkE), set/reset (S/R), and reverse set/reset (REV) control signals.

The memory element structure of FIG. 6 includes a memory element 601, a multiplexer (MUX) 602, a multiplexer control circuit 603, a clock control circuit 604, and an optional set/reset control circuit 605, coupled together as shown in FIG. 6. Memory element 601, clock control circuit 604, and set/reset control circuit 605 together constitute, for example, one of memory elements 402A–402D of FIGS. 4 and 5. Multiplexer 602 and multiplexer control circuit 603 together constitute a programmable multiplexer corresponding, for example, to multiplexers 412A–412D of FIGS. 4 and 5.

When the memory element is used in a user design, multiplexer control circuit 603 is programmed to control multiplexer 602 to select one of the data input signals (ME_DATAIN) and provide the selected signal ME_D to memory element 601. For example, one of the configuration memory cells in multiplexer control circuit 603 can be set to a one (high) value, while the other configuration memory cells are set to zero values. This state is detected and a "memory element used" signal is sent to clock control circuit 604. Any edges on the memory element control signals are passed through clock control circuit 604 to memory element 601 as Write Clock signals, or to set/reset control circuit 605 as Set/Reset Clock signals. Thus, memory element 601 performs in a standard fashion in response to data write, initialization (restore), set, and/or reset control signals.

When the memory element 601 is not utilized by a user design, multiplexer control circuit 603 is programmed to control multiplexer 602 to select none of the data input signals (ME_DATAIN). For example, configuration memory cells in multiplexer control circuit 603 can be set to all zero (low) values. This state is detected and a "memory element unused" signal is sent to clock control circuit 604. Any edges on the memory element control signals (e.g., clock signals, initialization signals, set signals, and/or reset signals) are intercepted by clock control circuit 604, and not passed on to memory element 601 (Write Clock(s)). When optional set/reset control circuit 605 is included in the structure and the memory element is unused, clock control circuit 604 also prevents the set/reset signal edges (Set/Reset Clock(s)) from reaching set/reset control circuit 605. Thus, memory element 601 does not consume unnecessary power by performing irrelevant data write, initialization, set, and/or reset operations.

Figure 7:
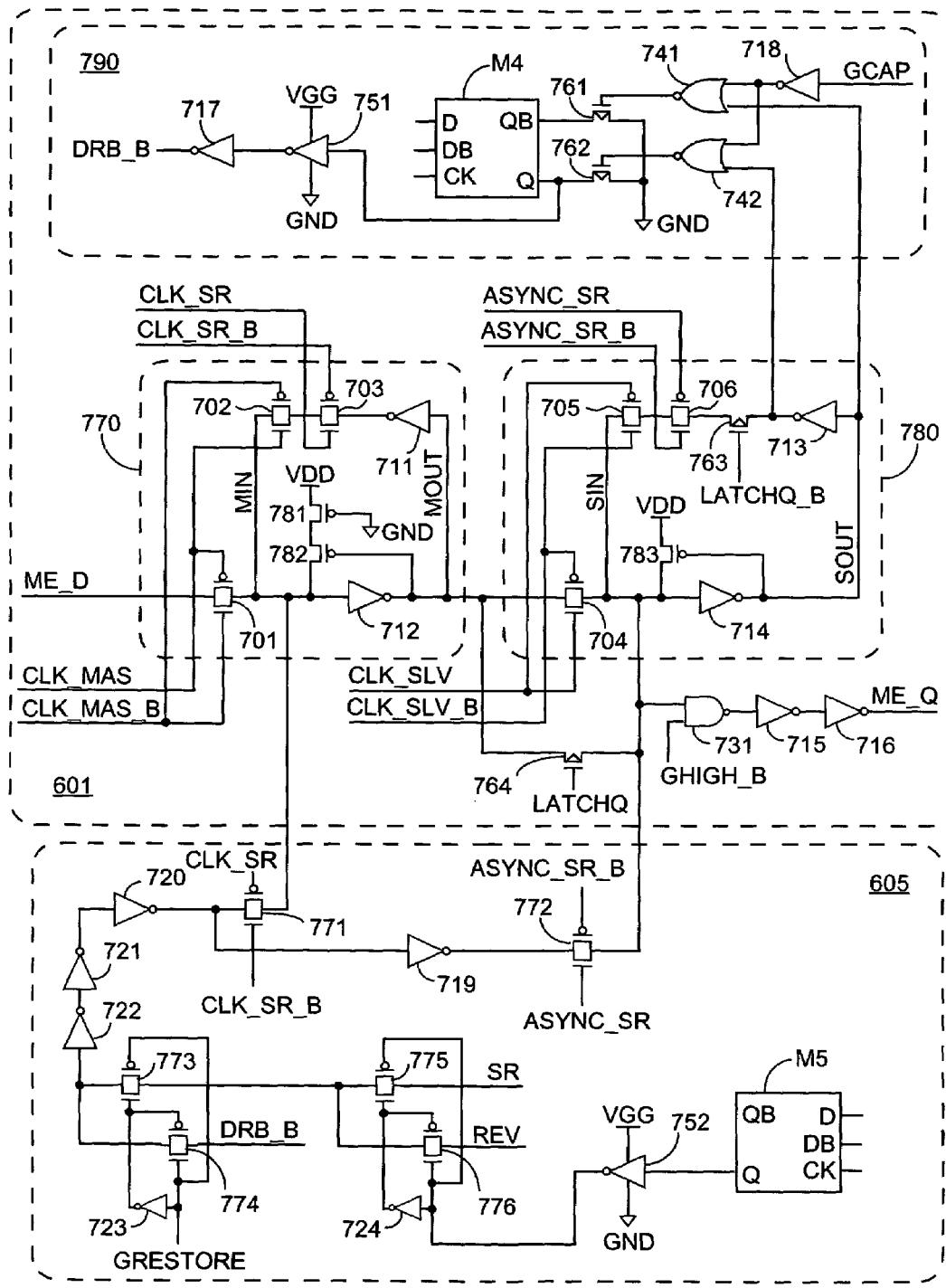
FIG. 7 illustrates an exemplary memory element and a set/reset control circuit that can be included, for example, in the memory element structure of FIG. 6.

FIG. 7 illustrates an exemplary memory element 601 and a set/reset control circuit 605 that can be included, for example, in the memory element structure of FIG. 6. (Note that other memory elements and set/reset control circuits can be used instead of the exemplary circuits provided in FIG. 7. Memory elements and set/reset control circuits are well known in the relevant arts. The circuits illustrated in FIG. 7 are purely exemplary and are not limiting.) Area 601 delineates a master-slave flip-flop/latch (the memory element), in which area 790 delineates an optional capture/restore circuit 790 for the memory element. Area 605 delineates a set/reset control circuit coupled to the master-slave flip-flop/latch. The structure of FIG. 7 includes CMOS pass gates 701–706 and 771–776, VDD/GND inverters 711–724, VGG/GND inverters 751–752, NOR gates 741–742, NAND gate 731, P-channel transistors 781–783, memory cells M4 and M5, and mid-oxide N-channel transistors 761–764, coupled together as shown in FIG. 7. The signals named in FIG. 7 are shown in Table 1, with their functions and origins. The letters "N/A" indicate that the signal is generated within FIG. 7 ("not applicable").

TABLE 1

| Signal Name | Signal Function | External Origin |
|---|---|---|
| ME_D | Memory element input data | Multiplexer 602 |
| CLK_MAS, CLK_MAS_B | Master latch write clock | Clock control circuit 604 |
| CLK_SLV, CLK_SLV_B | Slave latch write clock | Clock control circuit 604 |
| MIN, MOUT | Input & output nodes of master | N/A |
| SIN, SOUT | Input & output nodes of slave | N/A |
| LATCHQ*, LATCHQ_B* | Flip-flop/latch function select | Memory cell (not shown) |
| GHIGH_B* | Low value drives outputs high | Global signal for PLD |
| CLK_SR, CLK_SR_B | Synchronous set/reset control | Clock control circuit 604 |
| ASYNC_SR, ASYNC_SR_B | Asynchronous set/reset control | Clock control circuit 604 |
| SR* | Set or reset control | Slice input signal |
| REV* | Reset or set control | Slice input signal |
| GCAP* | Captures slave data in M4 | Global signal for PLD |
| GRESTORE* | Restores data from M4 | Global signal for PLD |

TABLE 1-continued

| Signal Name | Signal Function | External Origin |
|---|---|---|
| DRB_B | Data to be restored from M4 | N/A |
| ME_Q | Memory element output data | N/A |

*Indicates control signal shared by other memory elements in the slice

Memory element 601 includes a master latch 770 and a slave latch 780. The memory element input data ME_D from multiplexer 602 (see FIG. 6) is written to the master latch when master latch write clock CLK_MAS is low and CLK_MAS_B is high. P-channel transistors 781 and 782 are coupled in series between the input node MIN and power high VDD, with transistor 782 being gated by the output node MOUT of the master latch and transistor 781 being gated by ground GND. This pull-up arrangement is used because in the pictured embodiment multiplexer 602 includes only N-channel transistors, not CMOS pass gates (see FIG. 8). Therefore, the exemplary pull-up arrangement ensures that the input node MIN reaches a high value of VDD.

The output signal MOUT from the master latch is written to the slave latch when slave latch write clock CLK_SLV is high and CLK_SLV_B is low. P-channel transistor 783 is coupled between the input node SIN of the slave latch and power high VDD, and is gated by the output node SOUT of the slave latch. This pull-up arrangement is used because in some circumstances, a new value is written to the slave latch 780 via N-channel transistor 764, rather than through a CMOS pass gate (e.g., 704). Therefore, the exemplary pull-up arrangement ensures that the input node SIN reaches a high value of VDD in this situation.

When signal LATCHQ is high and LATCHQ_B is low, the memory element functions as a latch. Mid-oxide N-channel transistor 764 bypasses CMOS transistor 704, and the output signal MOUT from master latch 770 is passed to the input node SIN of the slave latch without waiting for the slave latch write clock signal to go high. From input node SIN of the slave latch, the signal passes through NAND gate 731 and inverters 715–716 to the output terminal ME_Q of the memory element. When signal LATCHQ is low and LATCHQ_B is high, the master and slave latches work together to function as a flip-flop.

When global signal GHIGH_B is low, the output ME_Q of the memory element is forced to a high value. This is simply a feature of the PLD in which the exemplary memory element is used, designed to prevent contention while values are written to the configuration memory cells (e.g., M4, M5) of the PLD.

Also included in memory element 601 is an optional capture/restore circuit 790. When global signal GCAP goes high, the value in the slave latch is captured in memory cell M4, via mid-oxide transistors 761–762. When signal GRE-STORE goes high, the value DRB_B from memory cell M4 is written back into both the master latch and the slave latch (see set/reset control circuit 605 and clock control circuit 604).

Set/reset control circuit 605 includes CMOS pass gates that write various values into the master and slave latches. Synchronous set/reset control signals CLK_SR and CLK_SR_B write a selected restore, set, or reset value to the master latch. Asynchronous set/reset control signals ASYNC_SR and ASYNC_SR_B write the restore, set, or reset value to both the master latch and the slave latch (i.e., the new value appears at the memory element output terminal without waiting for a high value on the slave latch write clock CLK_SLV). Memory cell M5 (e.g., a configuration memory cell of the PLD) controls a selection between signal SR (set/reset) and REV (reset/set), external input signals to the slice. Thus, each memory element can be individually controlled as a set or a reset memory element.

Note that in the pictured embodiment, memory cells M4 and M5 operate at a high voltage VGG higher than the standard high voltage VDD. Therefore, transistors coupled to the output terminals of these memory cells (e.g., transistors 761–762 and VGG/GND inverters 751–752) have a thicker oxide ("mid-oxide") than other transistors included in the circuit, which are coupled to signals having a high value of VDD. Signals LATCHQ and LATCHQ_B also have a high value of VGG. Therefore, transistors 763 and 764 also have the thicker oxide layer over the gate areas.

Figure 8:
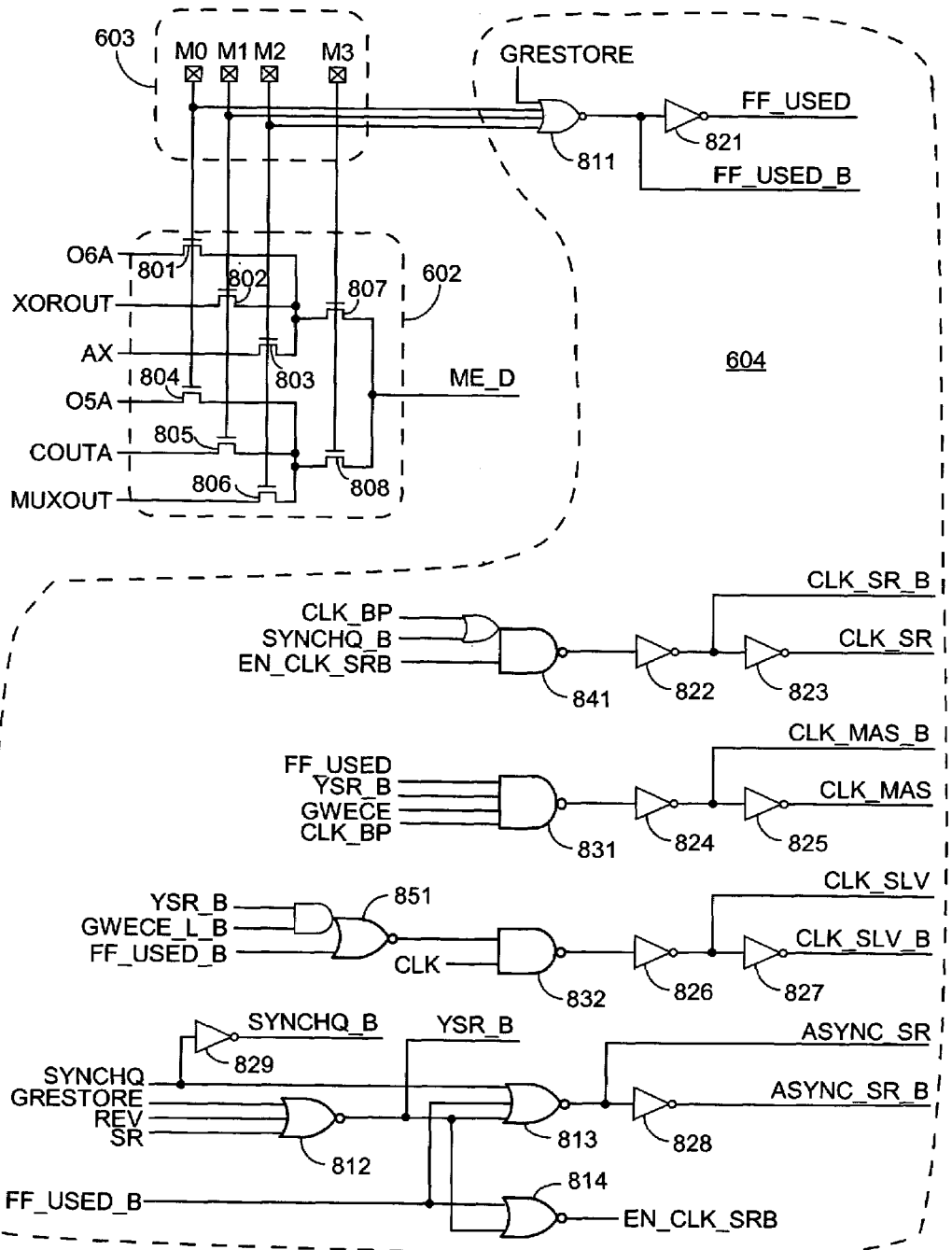
FIG. 8 illustrates an exemplary programmable multiplexer and a clock control circuit that can be included, for example, in the memory element structure of FIG. 6.

FIG. 8 illustrates an exemplary programmable multiplexer and a clock control circuit that can be included, for example, in the memory element structure of FIG. 6. (Note that other programmable multiplexers and clock control circuits can be used instead of the exemplary circuits provided in FIG. 8. Programmable multiplexers and clock control circuits are well known in the relevant arts. The circuits illustrated in FIG. 8 are purely exemplary and are not limiting.) The structure of FIG. 8 includes memory cells M0–M3, N-channel transistors 801–808, NOR gates 811–814, NAND gates 831–832, VDD/GND inverters 821–829, OR-NAND gate 841, and AND-NOR gate 851, coupled together as shown in FIG. 8. The signals newly named in FIG. 8 (i.e., not previously included in Table 1) are shown in Table 2, with their functions and origins. The letters "N/A" indicate that the signal is generated within FIG. 8 ("not applicable").

TABLE 2

| Signal Name | Signal Function | External Origin |
|---|---|---|
| O6A, XOROUT, AX, O5A, COUTA, MUXOUT | Data inputs | Elsewhere in slice |
| FF_USED, FF_USED_B | Memory element status | N/A |
| CLK* | Slice clock | Elsewhere in slice |
| CLK_BP* | Buffered, inverted slice clock | Elsewhere in slice |
| SYNCHQ, SYNCHQ_B* | Selects sync/async functionality | Elsewhere in slice |
| EN_CLK_SRB | Low enables sync set/reset | N/A |

TABLE 2-continued

| Signal Name | Signal Function | External Origin |
| --- | --- | --- |
| YSR_B | Indicates set/reset in progress | N/A |
| GWECE* | Write enable/clock enable high | Elsewhere in slice |
| GWECE_L_B* | Latched, inverted GWECE | Elsewhere in slice |

*Indicates control signal shared by other memory elements in the slice

The programmable multiplexer of FIG. 8 includes multiplexer 602 and multiplexer control circuit 603, which is coupled to control multiplexer 602. The programmable multiplexer 602/603 can correspond, for example, to multiplexer 412A of FIGS. 4 and 5. In the pictured embodiment, multiplexer control circuit 603 includes four configuration memory cells M0–M3 of the PLD in which the exemplary memory element structure resides. The six input signals for the exemplary multiplexer 602 include two output signals O6A, O5A from an associated LUT (e.g., LUT 401A of FIG. 4 or 501A of FIG. 5), an XOR output signal XOROUT (e.g., from XOR gate 413A in FIGS. 4–5), a bypass input signal of the slice (e.g., AX in FIGS. 4–5), a carry output signal (e.g., signal COUTA of FIGS. 4–5), and a multiplexer output signal MUXOUT (e.g., from multiplexer 419 of FIGS. 4–5).

When none of the six input signals is selected to be provided to the memory element, the memory cells in multiplexer control circuit 603 will store a predetermined value (e.g., all zeros in the pictured embodiment). This value is detected by NOR gate 811, and the signal FF_USED_B goes high, indicating that the memory element is not used in the design programmed into the PLD. Signal FF_USED goes low. Signals FF_USED and FF_USED_B are used by the clock control circuit 604 to disable write, set, and reset clocks for the memory element 601. Note that during a restore function (i.e., when signal GRESTORE is high), signal FF_USED_B is always low and signal FF_USED is always high in the pictured embodiment. Therefore, a restore function takes place even when the memory element is not utilized in the user design. However, in some embodiments the restore function is disabled when the memory element is not utilized.

The synchronous set/reset control signal CLK_SR_B goes high (and CLK_SR goes low) only when synchronous set/reset is enabled, i.e., when signal EN_CLK_SRB is high. For signal EN_CLK_SRB to go high, the memory element must be used (FF_USED_B is low) and a restore, set, or reset function must be in progress (YSR_B is low, i.e., one of GRESTORE, REV, and SR is high). Signal CLK_SR_B also goes high only when either the slice clock goes low (CLK_BP is high) or asynchronous behavior is selected for the restore/set/reset functions (SYNCHQ_B is high). When these conditions occur, one of the restore value DRB_B, the set/reset value SR, and the reset/set value REV is written to the master latch 770.

The synchronous master latch write clock signal CLK_MAS_B goes high (and CLK_MAS goes low) only when the flip-flop is used (FF_USED is high), no restore, set, or reset function is in progress (YSR_B is high), global write enable and clock enable are both active (GWECE is high), and the slice clock goes low (CLK_BP is high). When these conditions occur, the memory element data input ME_D is written to the master latch.

The synchronous slave latch write clock signal CLK_SLV goes high (and CLK_SLV_B goes low) only when the flip-flop is used (FF_USED_B is low) and the slice clock goes high (CLK is high). Additionally, either a restore, set, or reset function must be in progress (YSR_B is low), or the global write enable and clock enable are both active (GWECE_L_B is low). When these conditions occur, the output value MOUT from the master latch is written to the slave latch.

The asynchronous set/reset control signal ASYNC_SR goes high (and ASYNC_SR_B goes low) only when the memory element is used (FF_USED_B is low) and asynchronous behavior is selected for the restore/set/reset functions (SYNCHQ is low). Additionally, a restore, set, or reset function must be in progress (YSR_B is low, i.e., one of GRESTORE, REV, and SR is high). When these conditions occur, one of the restore value DRB_B, the set/reset value SR, and the reset/set value REV is written to the slave latch 780.

Those having skill in the relevant arts of the invention will now perceive various modifications and additions that can be made as a result of the disclosure herein. For example, the above text describes the circuits of the invention in the context of programmable logic devices (PLDs) such as FPGAs. However, the circuits and structures of the invention can also be implemented in other integrated circuits, including non-programmable circuits. The circuits and structures of the invention can also be implemented in other electronic systems, for example, in printed circuit boards including discrete devices.

Further, CMOS pass gates, transistors, P-channel transistors, N-channel transistors, mid-oxide transistors, memory cells, inverters, NAND gates, NOR gates, AND-NOR gates, OR-NAND gates, master latches, slave latches, flip-flops, memory elements, programmable multiplexers, multiplexers, multiplexer control circuits, clock control circuits, set/reset control circuits, capture and restore circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known. It will be apparent to one skilled in the art after reading this specification that the present invention can be practiced within these and other architectural variations.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A structure, comprising:
   a multiplexer having a plurality of input terminals, an output terminal, and a select terminal;
   a memory element having a data input terminal coupled to the output terminal of the multiplexer, a clock input terminal, and a data output terminal;
   a multiplexer control circuit having a first output terminal coupled to the select terminal of the multiplexer and further having a second output terminal; and
   a clock control circuit having a first input terminal coupled to receive a control signal; a second input terminal coupled to the second output terminal of the multiplexer control circuit, and a first clock output terminal coupled to the clock input terminal of the memory element.

2. The structure of claim 1, wherein the clock control circuit further comprises a second clock output terminal, and wherein the memory element comprises:
   a master latch having an input terminal coupled to the data input terminal of the memory element, a clock terminal coupled to the first clock output terminal of the clock control circuit, and an output terminal; and
   a slave latch having an input terminal coupled to the output terminal of the master latch, a clock terminal coupled to the second clock output terminal of the clock control circuit, and an output terminal coupled to the data output terminal of the memory element.

3. The structure of claim 1, wherein the clock control circuit further comprises a second clock output terminal, and wherein the structure further comprises:
   a set/reset control circuit having an input terminal coupled to the second clock output terminal of the clock control circuit, and further having an output terminal coupled to provide a data signal to the memory element.

4. The structure of claim 1, wherein the memory element comprises a circuit configurable as a flip-flop and further configurable as a latch.

5. The structure of claim 1, wherein the multiplexer control circuit comprises at least one memory cell, the at least one memory cell controlling a value provided to the clock control circuit via the second output terminal of the multiplexer control circuit.

6. The structure of claim 1, wherein the structure comprises a programmable logic device (PLD), and the at least one memory cell comprises a configuration memory cell of the PLD.

7. The structure of claim 6, wherein the PLD comprises an FPGA.

8. A structure, comprising:
   a memory element having a data input terminal and a clock input terminal;
   first means for selecting at most one of a plurality of data values and providing the selected data value to the data input terminal of the memory element, wherein in a first state the first means selects one of the data values, and in a second state the first means selects none of the data values; and
   second means for providing a clock edge to the clock input terminal of the memory element when the first means is in the first state, and not providing the clock edge to the clock input terminal of the memory element when the first means is in the second state.

9. The structure of claim 8, wherein the first means comprises a programmable multiplexer.

10. The structure of claim 8, further comprising means for initializing the memory element to a known value in response to an initialization signal when the first means is in the first state, and not initializing the memory element to the known value in response to the initialization signal when the first means is in the second state.

11. The structure of claim 8, further comprising means for setting contents of the memory element to a high value in response to a set signal when the first means is in the first state, and not setting the contents of the memory element to the high value in response to the set signal when the first means is in the second state.

12. The structure of claim 8, further comprising means for resetting contents of the memory element to a low value in response to a reset signal when the first means is in the first state, and not resetting the contents of the memory element to the low value in response to the reset signal when the first means is in the second state.

13. The structure of claim 8, wherein the first means comprises at least one programmable memory cell, and wherein the second means comprises means for detecting that a predetermined value is stored in the at least one programmable memory cell.

14. The structure of claim 8, wherein the structure comprises a programmable logic device (PLD), and the first means comprises a multiplexer controlled by at least one configuration memory cell of the PLD.

15. A programmable logic device (PLD), comprising:
   a memory element having a data input terminal and a clock input terminal;
   a multiplexer having a plurality of data input terminals, and further having an output terminal coupled to the data input terminal of the memory element;
   means for programmably controlling the multiplexer to decouple all of the data input terminals from the output terminal of the multiplexer; and
   means for decoupling the clock input terminal of the memory element from a clock signal source when the multiplexer is programmably controlled to decouple all of the data input terminals from the output terminal of the multiplexer.

16. The PLD of claim 15, further comprising means for initializing the memory element to a known value in response to an initialization signal when the multiplexer is not programmably controlled to decouple all of the data input terminals from the output terminal of the multiplexer, and not initializing the memory element to the known value in response to the initialization signal when the multiplexer is programmably controlled to decouple all of the data input terminals from the output terminal of the multiplexer.

17. The PLD of claim 15, further comprising means for setting the contents of the memory element to a high value in response to a set signal when the multiplexer is not programmably controlled to decouple all of the data input terminals from the output terminal of the multiplexer, and not setting the contents of the memory element to the high value in response to the set signal when the multiplexer is programmably controlled to decouple all of the data input terminals from the output terminal of the multiplexer.

18. The PLD of claim 15, further comprising means for resetting the contents of the memory element to a low value in response to a reset signal when the multiplexer is not programmably controlled to decouple all of the data input terminals from the output terminal of the multiplexer, and not resetting the contents of the memory element to the low value in response to the reset signal when the multiplexer is programmably controlled to decouple all of the data input terminals from the output terminal of the multiplexer.

19. The PLD of claim 15, wherein the means for programmably controlling the multiplexer comprises at least one configuration memory cell of the PLD, and wherein the means for decoupling the clock input terminal of the memory element from a clock signal source comprises means for detecting that a predetermined value is stored in the at least one configuration memory cell.

20. The PLD of claim 15, wherein the PLD comprises a field programmable gate array (FPGA).

* * * * *